April 18, 1967 J. A. LUKSCH ETAL 3,315,165

SINGLE TUNING PARAMETRIC AMPLIFIER

Filed Aug. 21, 1963 2 Sheets-Sheet 1

INVENTORS:
JAMES A. LUKSCH
VITALY STACHEJKO
BY Ernest F. Weinberger
Max L. Garner
ATTORNEYS

SINGLE TUNING PARAMETRIC AMPLIFIER

INVENTORS.
JAMES A. LUKSCH
VITALY STACHEJKO
BY Ernest F. Weinberger
Max D. Parmer
ATTORNEYS

United States Patent Office 3,315,165

Patented Apr. 18, 1967

3,315,165

SINGLE TUNING PARAMETRIC AMPLIFIER

James A. Luksch, Cherry Hill, and Vitaly Stachejko, Levittown, N.J., assignors, by mesne assignments, to the United States of America as represented by the Secretary of the Navy Filed Aug. 21, 1963, Ser. No. 303,695
1 Claim. (Cl. 325—25)

This invention relates to high frequency microwave parametric amplifiers and more particularly to a high gain amplifier which may be tuned by the adjustment of a single element.

Parametric amplifiers are presently quite well known in the art and can theoretically be developed utilizing both inductive and capacitive non-linear elements. Comparing these amplifiers with the common regenerative amplifier wherein the limit of gain is attained when the positive feedback increase to such a point where the amplifier breaks into oscillation, it is essential that in a parametric amplifier the negative resistance be held below a critical level at which the circuit will oscillate. Therefore, it is clear that the gain of such devices is limited, although they have great utility by virtue of their inherent low noise characteristics. Another inherent limitation of present amplifiers is the fact that they must be individually tuned and in particular, more than one tuning adjustment is necessary.

In general, parametric amplifiers employ a non-linear element to which is introduced a signal wave to be amplified and a pump wave which acts to vary the impedance of the non-linear element to produce amplification. In the "up-converter" form of amplifier instead of the amplified input signal being the sole output, the sum or difference of the signal and pump frequencies constitute the principal output. Descriptions and analysis of such devices is quite common in the literature and are thoroughly treated. Conventional diode parametric amplifiers generally involve the control of three frequencies, namely, pump ($F_p$), signal ($F_s$) and either, the sum or difference therebetween. The present invention contemplates broadband operation of a four frequency upconverter which is tunable by the use of only one adjustment.

It is an object of this invention to produce four frequency, sum frequency up-conversion with a gain far in excess of that attainable with conventional three-frequency, sum frequency, up-conversion.

Another object is to provide a parametric amplifier which combines high gain, simple tuning stability and simplicity of operation.

Still another object is to provide a parametric amplifier employing a novel adjustable tuning means which does not affect other tuned parameters.

A further object being to provide an amplifier which may be coupled with a transmitter to tune narrowly therewith and which can readily permit pulse-to-pulse tuning, thereby being advantageous for anti-jamming, reduction of imaging and noise.

Other objects and advantages will appear from the following description of an example of the invention, and the novel features will be particuarly pointed out in the appended claim.

Figure 1:
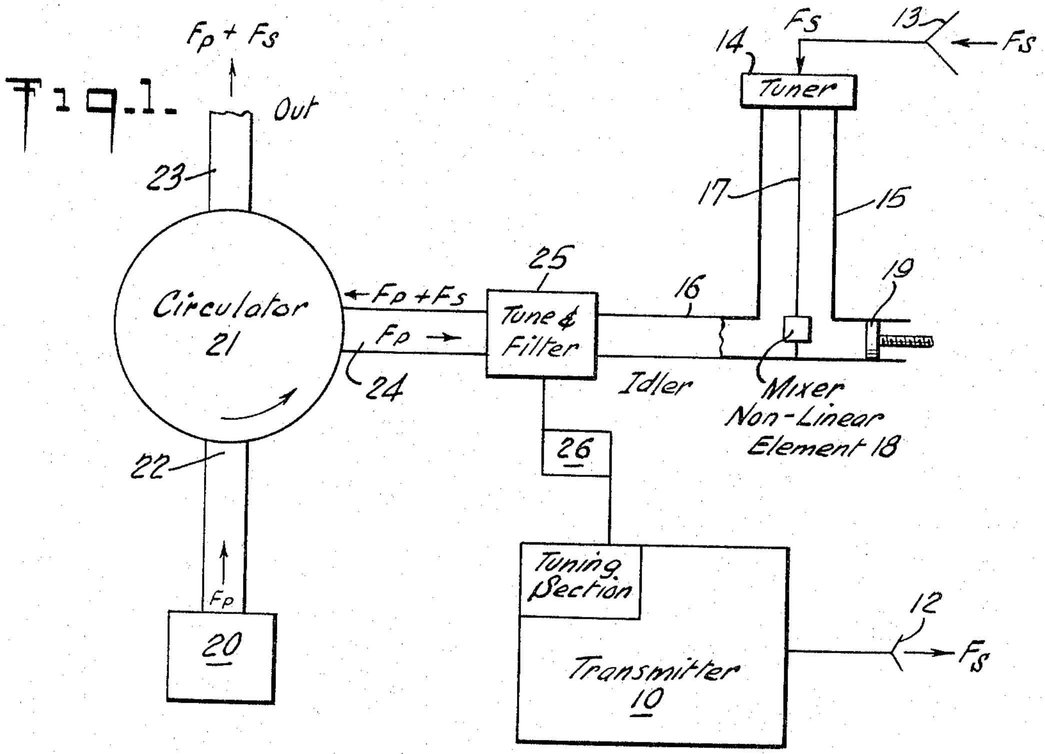
Figure 2:
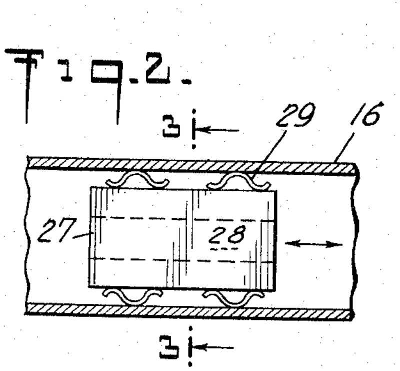
Figure 3:
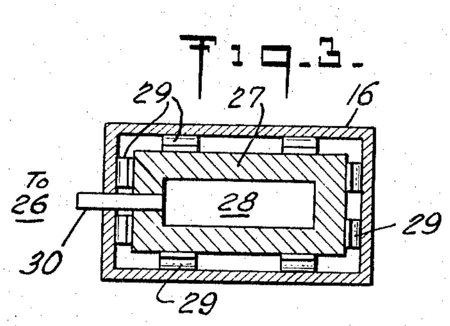
Figure 4:
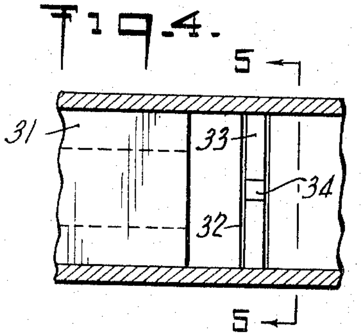
Figure 5:
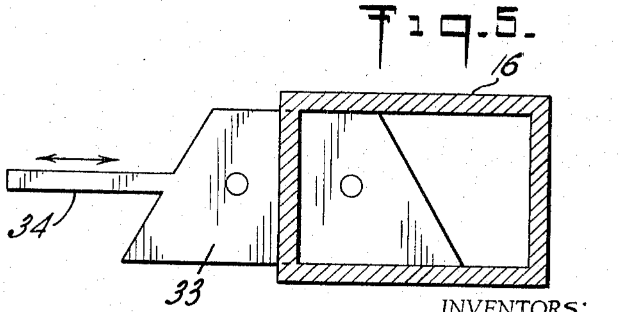
Figure 6:
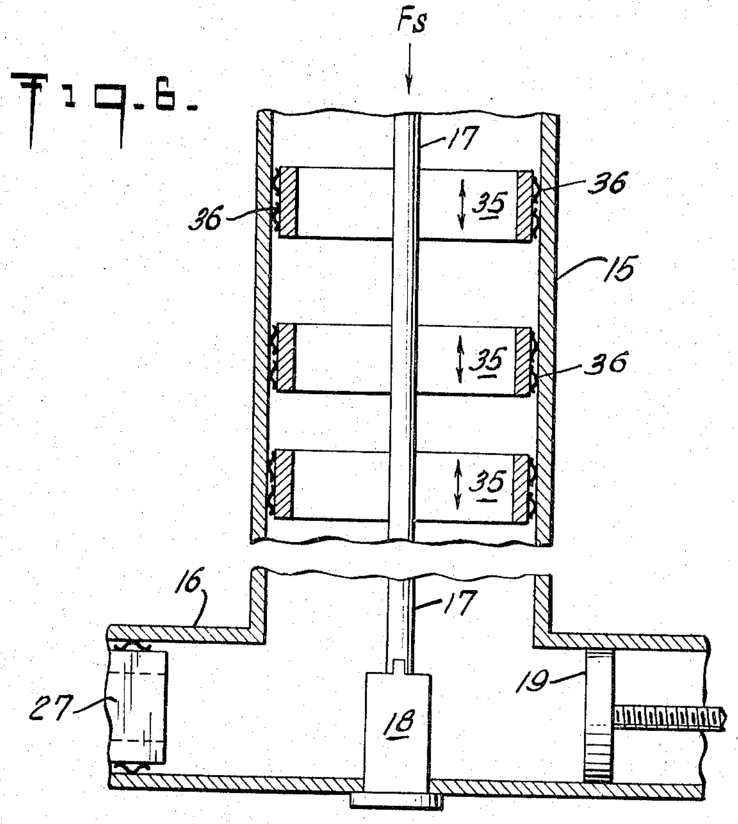
Figure 7:
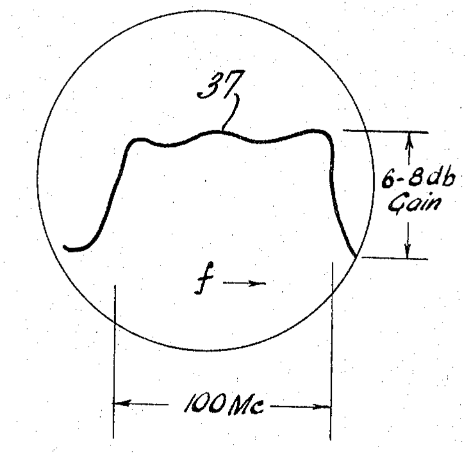
Figure 8:
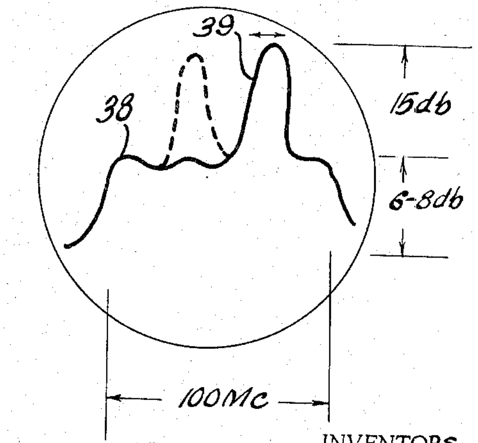

In the accompanying drawings:

FIG. 1 is a block type representation of an amplifier embodiment utilizing the principle of this invention, FIG. 2 is a cross-section of a filter/tuner used in the embodiment of FIG. 1, FIG. 3 is a cross-section taken approximately along line 3—3 of FIG. 2, FIG. 4 is another filter/tuner useable with the embodiment, FIG. 5 is a cross-section taken approximately along line 5—5 of FIG. 4, FIG. 6 is a sectional view of a broadband input tuner of the embodiment, and FIGS. 7 and 8 are graphical representations of the output of two identical parametric amplifiers with and without employment of the principle of this invention.

In the illustrated embodiment of FIG. 1, a microwave transmitter 10, having a standard tuning section 11, radiates through antenna 12 a signal at frequency $F_s$. The returning signal is picked up by another antenna 13 and applied to a broadband tuner 14 which feeds a coaxial hollow waveguide section 15, which terminates and joins with an ider waveguide tank circuit in general designated at 16. The outer wall of the coaxial waveguide is connected to the waveguide section 16 in the conventional manner, while the inner conductor 17 passes therethrough and projects into the section 16 where it is connected to a non-linear mixer element 18. The other terminal of element 18 joins the waveguide 16 at a point opposite to that of its connection to the center conductor 17. The non-linear element may be of many different well-known types presently employed but it has been found that satisfactory results are obtained with variable capacity semiconductor varactor diodes. The plunger 19 or shorting bar is movable lengthwise of the waveguide and serves, as is known, to properly match the pump power to the waveguide 16 and adjust the voltage generated across the diode element 18 for a maximum at the pump frequency.

A source of pump frequency ($F_p$) 20 may be any oscillator capable of delivering sufficient energy at the desired frequency and as in typical parametric amplifiers, a klystron is suitable. In order to apply this pump frequency from the source 20 to the idler tank circuit and the non-linear element 18, a circulator 21 is employed. The circulator is a device that serves as a junction and also as an isolator for and between multiple waveguides connected thereto. As in this embodiment, between the pump source input 22, the output 23 and the coupling 24, each waveguide is coupled to the circulator in such a manner as to pass microwave energy only to the next succeeding waveguide without any energy being fed back to the preceding waveguide. The input from coupling 24 to the circulator, for example, will only be fed to the output 23 and isolated from the other waveguide. A typical circulator suitable for use herein is described in the Bell Laboratories "Record," volume XXXV, No. 8 of August 1957, pages 293 to 297.

The pump frequency energy passes through the circulator 21, coupling 24, tunable filter means 25 and into the idler tank 16 where it simultaneously coexists with the signal frequency, both of which react at and on the non-linear element 18 to develop the combined frequencies. The frequencies in the idler tank include the input, a very strong pump frequency as well as their sum and difference frequencies, developed by the mixing action of element 18. The filter/tuner 25, whose structure will be hereinafter described, permits only the passage therethrough of frequencies including and lying above the pump frequency and at the same time can be adjusted (tuned) to resonate the idler tank for the difference frequency ($F_p - F_s$) so that the amplified output is the sum frequency ($F_p + F_s$). The resonance provides the entire device with regeneration feedback while also restricting the output to a rather narrow band.

By coupling the tuner/filter means 25, either mechanically (e.g. a linkage arm) or electrically, as for example, servo system, represented by block 26, to the tuning section of the transmitter, the parametric amplifier or receiver is tunably synchronized with the transmitter and is thereby capable of pulse-to-pulse tuning.

FIGS. 2 and 3 illustrate one embodiment of a tuner/filter suitable for use in the embodiment of FIG. 1 wherein a restricted waveguide section 27 is disposed within the waveguide 16. The section 27 is provided with a central passage 28 which is of lesser dimensions than the guide 16 and therefore is cut off below a certain frequency dependent on the passage dimensions. By selecting the proper dimensions, this restricted waveguide section will effectively filter out the difference frequency and act in most respects, as a high pass filter. The section 27 is provided on its outer walls with metallic spring fingers 29 which serve to electrically join the section with the walls of the waveguide within which it is disposed. Additionally, these fingers allow the section 27 to be moved lengthwise of the waveguide. Many common techniques can be employed to move the section but probably simplest is merely a dielectric arm 30 extending from one sidewall of the section outwardly through the opposing wall of waveguide 16 where it can be mechanically linked to a drive system. This restricted waveguide section 27 can be moved toward and away from the non-linear element 18 and thereby resonate the idler tank circuit to the difference frequency.

A second embodiment is illustrated in FIGS. 4 and 5 wherein a fixed waveguide restriction 31 or filter similar to that of FIGS. 2 and 3, except that the spring finger has been deleted. One transverse sidewall of waveguide 16 is provided with a vertical slot 32 within which is disposed a dielectric vane or slab 33 which may be of any suitable dielectric such as Rexolite. This structural arrangement permits transverse insertion of the vane 33 into the waveguide as by handle 34 which, thereby, serves to resonate the idler tank circuit much in the manner as the movement of the restricted section 27. The handle 34 may be coupled to the transmitter tuning section by any suitable means to operate in conjunction therewith for pulse-to-pulse tuning capability.

Since it is desirable to attain a system wherein the frequency of operation can be extended over a rather wide range, it is essential to incorporate broadband tuning at the input stage. For this purpose the broadband tuner illustrated in FIG. 6 has been employed. A multiplicity, in our case, three short-ring-like metallic cylinders 35 are spaced apart and disposed lengthwise along the coaxial waveguide 15. The diameter of each cylinder is slightly less than the inner diameter of the waveguide so as to allow the disposition therebetween of an electrical contact which also permits movement of the cylinder. Again, spring contacts 36 extending circumferentially about the cylinder would be suitable for this purpose. By well-known techniques, the spacing between adjacent cylinders and their spacing from opposite ends of the waveguide 16 can be determined to provide relatively broadband tuning. On the other hand, this procedure can be accomplished empirically, especially by one skilled in the art. Broadband, as used herein, is intended although not limited thereto to be a range of at least 100 megacycles for a signal frequency of at least 1 kilomegacycle. A typical gain or response output curve 37 of a parametric amplifier not incorporating the single tuning feature of this invention is shown in FIG. 7. As may be observed, the overall gain (6–8 db) is relatively constant as is the tuning thereof over the 100 mc. bandwidth. Comparing this to curve 38 of FIG. 8 for a tuned amplifier constructed in accordance with the principle of this invention, it is clear that the gain increases to approximately 15 db for any particular frequency to which the amplifier is tuned. As the resonance of the idler circuit is varied, the upper tuned portion 38 is displaced from one end of the curve to the other.

The mode of operation used in this invention is sum-frequency up-conversion (the output is taken at $f_p+f_s$) with loading at the difference frequency producing regeneration and a resultant increased power gain. This inventive mode of operation was chosen: (1) because it produces considerable non-regenerative gain while it affords the theoretical possibility of maintaining a positive input resistance even with regeneration, (2) the required resonance of the difference frequency is accomplished in a way which does not affect the other tuning conditions while its resonant frequency can be changed in a simple direct manner. Additionally it is possible to use a ferrite phase shifter in place of the dielectric vane to tune the amplifier electronically and thereby increase the pulse-to-pulse versatility with anti-jamming capabilities. This is quite easily accomplished since the amplifier tuning is linear with movement.

We claim:

A four frequency up-conversion parametric device for amplification of an input signal comprising:

a broadband tuned coaxial input circuit, a waveguide idler tank circuit having therein a non-linear reactance mixing element, said idler circuit coupled to said input circuit, adjustable matching means for impedance matching of said idler circuit including a shorting bar disposed at one end of said idler waveguide movable lengthwise of said waveguide, a source of pump frequency, a circulator coupling said pump source with said idler circuit and having an output circuit, high-pass filter and tuning means disposed at the circulator end of said waveguide idler tank circuit for passing only said pump and up-converted sum frequencies and for tuning said idler circuit including a thin, plate-like dielectric slab having oppositely converging sides disposed at the other end of and crosswise of said idler waveguide, said slab being movable crosswise of said idler waveguide for tuning thereof, a transmitter having a tunable output wherein said input signal is the received signal from said transmitter, means for moving said slab, a coupling loop means between said transmitter and said means for moving said slab for controlling the movement of said slab in accordance with the tuning of said transmitter, whereby said idler will be tuned automatically with said transmitter and the output of said circulator is the amplified sum frequency of said received transmitter signal and said pump.

References Cited by the Examiner

UNITED STATES PATENTS 3,253,227 5/1966 Venohara ---------- 330—4.9

OTHER REFERENCES

Luksch et al.: "Proceedings of the IRE," June 1962, pp. 1540–1541.

ROY LAKE, *Primary Examiner.*

DARWIN R. HOSTETTER, *Examiner.*